United States Patent [19]
Fettweis et al.

[11] Patent Number: 5,633,897
[45] Date of Patent: May 27, 1997

[54] DIGITAL SIGNAL PROCESSOR OPTIMIZED FOR DECODING A SIGNAL ENCODED IN ACCORDANCE WITH A VITERBI ALGORITHM

[75] Inventors: Gerhard P. Fettweis, Dresden, Germany; Mihran Touriguian, Hercules, Calif.

[73] Assignee: Atmel Corporation, San Jose, Calif.

[21] Appl. No.: 558,745

[22] Filed: Nov. 16, 1995

[51] Int. Cl.⁶ .................. H03D 1/00; H04L 27/06
[52] U.S. Cl. .................................. 375/341; 371/43
[58] Field of Search .................... 375/261, 262, 375/264, 265, 298, 340, 341, 346, 348, 349; 371/43, 37.7; 329/331

[56] References Cited

U.S. PATENT DOCUMENTS

| | | |
|---|---|---|
| 5,291,524 | 3/1994 | Itakura et al. .................. 375/341 |
| 5,349,608 | 9/1994 | Graham et al. ................. 375/341 |
| 5,410,556 | 4/1995 | Yeh et al. ...................... 375/341 |
| 5,461,644 | 10/1995 | Bergmans et al. ............. 375/341 |

Primary Examiner—Tesfaldet Bocure
Assistant Examiner—Bryan Webster
Attorney, Agent, or Firm—Limbach & Limbach

[57] ABSTRACT

An improved DSP has two internal data buses with two MAC units each receiving data from its respective data bus. A shifter is interposed between the multiply unit and the ALU and accumulate unit. The improved DSP also has a multiplexer interposed between one of the MAC units and the two data buses. The improved DSP is optimized to decode a received digital signal encoded in accordance with the Viterbi algorithm, wherein the DSP calculates a first pair of binary signals $C_{2n}$ and $C_{2n+1}$ a Viterbi butterfly based upon a second pair of binary $C_n$ and $C_{n+m/2}$, and a transitional signal a, in accordance with: $C_{2n}$=minimum ($C_n$+a, $C_{n+m/2}$−a); $C_{2n+1}$=minimum ($C_n$−a, $C_{n+m/2}$+a).

12 Claims, 2 Drawing Sheets

5,633,897

1

DIGITAL SIGNAL PROCESSOR OPTIMIZED FOR DECODING A SIGNAL ENCODED IN ACCORDANCE WITH A VITERBI ALGORITHM

TECHNICAL FIELD

The present invention relates to a digital signal processor and more particularly to a digital signal processor which has been optimized to decode a received digital signal which is encoded in accordance with a Viterbi algorithm.

BACKGROUND OF THE INVENTION

Digital signal processors are well known in the art. Digital signal processors process signals and typically include a Multiply and Accumulate (MAC) unit. This is because for many signal processing applications, the operations of multiplication and addition (or accumulation) are frequently used.

In the field of communications, a Viterbi algorithm is also well known in the art. The Viterbi algorithm is applied to known states and determines the probability of their interconnection. If a signal is encoded e.g. with a convolution code, upon its receipt, it can be decoded in accordance with the Viterbi algorithm. The received signal, in digital form or binary bits, can be decoded in accordance with a trellis. A trellis is a state transition diagram, in which all states of a process (the encoder) are shown over discrete time instants "K". The trellis is formed by drawing all transitions from every state at time K to its possible successor states, typically at time "K+1." A typical trellis is formed by a plurality of combinations of two stage "butterflies." This is also well known in the art to be true, e.g. in case of rate –½ convolutional codes. Thus, in decoding a signal that is encoded in accordance with the Viterbi algorithm, it is frequently desired to calculate the output of the "butterfly".

This involves the calculation of a first pair of binary signals $C_{2n}$ and $C_{2n+1}$ (which are the outputs of a two stage butterfly), based upon a second pair of binary signals $C_n$ and $C_{n+m/2}$ (which are the inputs to the two stage butterfly) with a transitional signal a connecting the input to the output. The Viterbi algorithm calculates the following:

$$C_{2n} = \text{minimum } (C_n + a, C_{n+m/2} - a)$$

$$C_{2n+1} = \text{minimum } (C_n - a, C_{n+m/2} + a)$$

As can be seen from the foregoing, the calculations of the outputs of a two stage butterfly require addition, comparison, and selection. The add-compare-select, in the prior art, has been accomplished by either dedicated hardware or by a general purpose computer operating with appropriate software.

As for the former, because typically the decoding of Viterbi algorithm involves signal processing, a DSP or some other hardware circuit must be provided along with the dedicated hardware to decode the Viterbi two stage butterfly. As for the latter, it suffers from the disadvantage that many clock cycles are required to calculate the two stage butterfly.

SUMMARY OF THE INVENTION

Accordingly, in the present invention, a digital signal processor for decoding a received digital signal encoded in accordance with a Viterbi algorithm can calculate a first pair of binary signals $C_{2n}$ and $C_{2n+1}$, based upon a second pair of binary signals $C_n$ and $C_{n+m/2}$, and a transitional signal a in

2 accordance with $C_{2n}$=minimum $(C_n+a, C_{n+m/2}-a)$, $C_{2n+1}$= minimum $(C_n-a, C_{n+m/2}+a)$. The improvement to the digital signal processor comprises a first and a second data bus means for supplying simultaneously a first and a second plurality of binary signals, respectively. A first and a second shifter means are provided for receiving simultaneously a first input signal and for generating a third plurality of binary signals in response thereto. A first means supplies the first and second plurality binary signals as the first input signal to the first and the second shifter means, respectively. A first and a second Arithmetic Logic Unit (hereinafter referred to as "ALU" means are provided. Each of the first and second ALU means receives a second and a third input signal and generates an output signal, with the output signal representative of the second input signal added to or subtracted by the third input signal. A second means supplies the third plurality of binary signals from each of the first and second shifter means simultaneously as the second input signal to the first and second ALU means. A first and a second accumulator means receives simultaneously the output signals from the first and the second ALU means, respectively, and stores the output signals and supplies them as the third input signals to the first and the second ALU means, respectively. A minimum determining means receives the output signals from the first and the second accumulator means, compares them and selects the lesser of the two output signals stored in the first and the second accumulator means and generates a fifth plurality of binary signals in response thereto. A third accumulator means receives and stores the fifth plurality of binary signals.

The present invention also discloses a method of operating a digital signal processor having the aforementioned improvement.

DETAILED DESCRIPTION OF THE DRAWINGS

Figure 1:
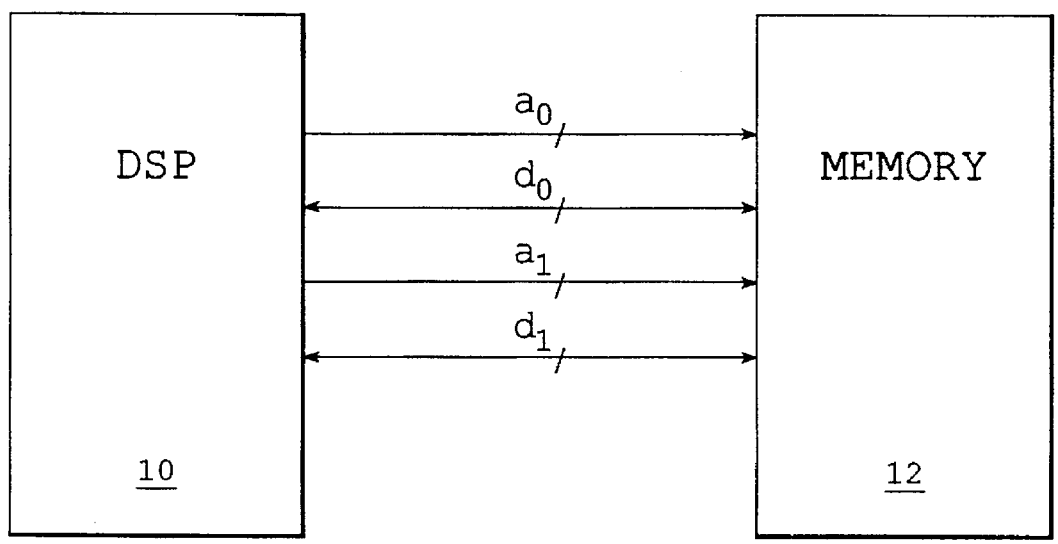
FIG. 1 is a schematic block level diagram of the digital signal processor of the present invention connected to a memory.
Figure 3:
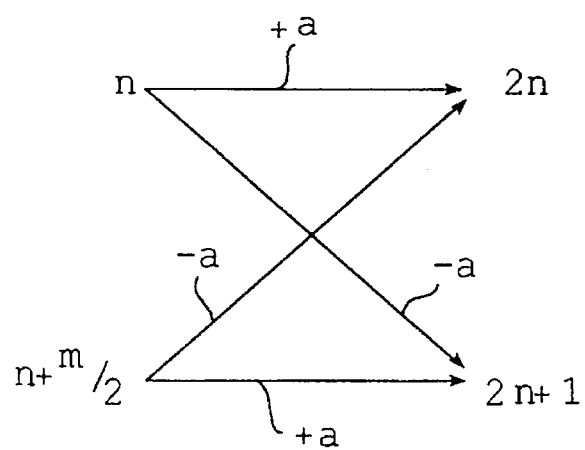
FIG. 3 is a two stage butterfly for decoding the prior art Viterbi signal to which the improvement to the digital signal processor of the present invention is optimized to perform.

Referring to FIG. 1 there is shown a block level diagram of a digital signal processor 10 having the improvement of the present invention. The digital signal processor 10, in the preferred embodiment, addresses a dual port memory 12 have two ports. The DSP 10 addresses locations within memory 12 in accordance with a first and a second plurality of address signals $a_0$ and $a_1$, respectively, and receives in response therefrom the data stored in the memory 12 as data signals $d_0$ and $d_1$, respectively. Although the DSP 10 is shown, in the preferred embodiment as comprising two address buses $a_0$ and $a_1$ and two data buses $d_0$ and $d_1$, the improvement to the DSP 10 of the present invention need not be limited to a digital signal processor 10 having dual buses. The DSP 10 can have a single address bus and a single data bus. As is well known in the art, the DSP 10 comprises an instruction fetch unit (not shown), an instruction decode unit (not shown) and other registers and logic circuits.

Figure 2:
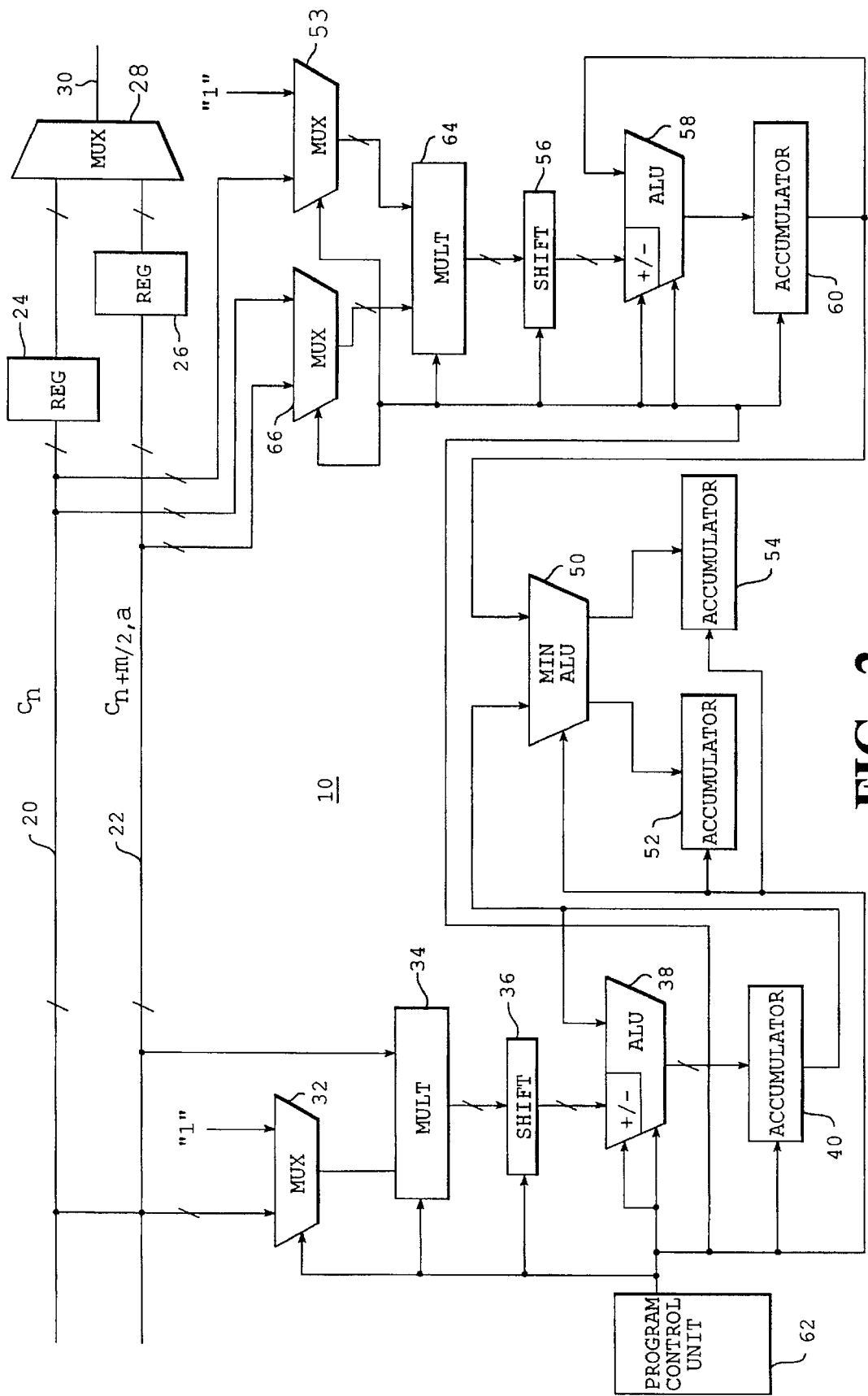
FIG. 2 is a detailed schematic block level diagram of a portion of the digital signal processor shown in FIG. 1, showing the improvement of the present invention.

The improvement to the DSP 10 of the present invention is shown in greater detail in FIG. 2. Within the DSP 10 is a first data bus 20 and a second data bus 22. Each data bus 20 and 22 in the preferred embodiments is 16 bits wide. Each of the first and second data buses 20 and 22, respectively, has an associated register 24 and 26, respectively. Each of the first and second registers 24 and 26, respectively, stores the plurality of binary signals that are supplied on the first and second data buses 20 and 22, respectively. The first and second registers 24 and 26 may be multiplexed through an I/O multiplexer 28 leading to a single input/output data bus 30. This single input/output data bus 30 can be connected to the memory 12 as the data bus thereto. As previously stated, in the preferred embodiment, the DSP 10 accesses the memory 12 via two data buses $d_0$ and $d_1$. Thus, in that event, the I/O multiplexer 28 and the input/output data bus 30 would not be needed and the first and second data buses 20 and 22, respectively, would be connected through their respective first and second registers 24 and 26 to the data buses $d_0$ and $d_1$ to the memory 12.

The first plurality of binary signals from the first data bus 20 are supplied to a first multiplexer 32, at a first input thereto. The binary signal "1" is supplied to a second input to the first multiplexer 32. The output of the first multiplexer 32 is supplied to a first multiplier 34, at one input thereto. The second plurality of binary signals from the second data bus 22 are supplied to the first multiplier 34 at its second input. The first multiplier 34 performs a binary multiplication of the signal supplied at the first input by the binary signal supplied at the second input and generates as its output a plurality of binary signals which are supplied to a first shifter 36.

The first shifter 36 serves to shift the binary signal supplied thereto to produce a shifted signal which is supplied to a first ALU 38, at one input thereto. The ALU 38 has a second input. The ALU 38 receives the binary signal supplied at the second input and adds or subtracts the binary signal supplied at the first input and produces an output signal in response thereto. The output signal is then supplied to a first accumulator 40. The first accumulator 40 stores the result or the output signal from the first ALU 38. The output of the first accumulator 40 is then supplied back to the first ALU 38 at the second input thereof. In addition, the output of the first accumulator 40 is supplied to the minimum ALU 50.

The first and second plurality of binary signals from the first and second data bus 20 and 22, respectively, are also supplied to a second multiplexer 66. The second multiplexer 66 receives the plurality of binary signals from the first and second data buses 20 and 22, respectively, and generates as an output thereof, a plurality of binary signals which are supplied to a second multiplier 64 at one input thereto. The first plurality of binary signals from the first data bus 20 is also supplied to a third multiplexer 53 at its one input. The binary signal of "1" is supplied to a second input of the third multiplexer 53. The third multiplexer 53 selects either the binary signal of "1" or the first plurality of binary signals from the first data bus 20 and generates in response thereto an output signal which is supplied to the second input to the second multiplier 64.

The second multiplier 64 multiplies the binary signals supplied from the output of the second multiplexer 66 by the binary signals supplied from the output of the third multiplexer 53 and generates in response thereto an output signal which is supplied to a second shifter 56. The second shifter 56 receives the output signal of the second multiplier 64 and generates a shifted signal in response thereto. The shifted signal is supplied to a second ALU unit 58 at one input thereto. The second ALU has a second input. The second ALU 58 also receives the binary signal supplied at the second input and adds or subtracts the binary signal supplied at the first input and produces an output signal in response thereto. The plurality of binary signals which is the output of the second ALU 58 is supplied to a second accumulator 60 and is stored therein. The plurality of binary signals stored in the second accumulator 60 is supplied to the second ALU 58 at its second input thereto. The plurality of binary signals stored in the second accumulator is also supplied to the second input of the minimum ALU 50.

The minimum ALU 50 receives the plurality of binary signals stored in the first accumulator 40 and the plurality of binary signals stored in the second accumulator 60 and generates an output signal which is a plurality of binary signals which is the lesser of the plurality of binary signals stored in the first or the second accumulator 40 and 60, respectively, and stores it in a third accumulator 52. In addition, in a second operation (to be described in greater detail hereinafter), the output of the minimum ALU 50 is stored in a fourth accumulator 54.

As previously discussed, the improved DSP 10 of the present invention is optimized to perform the decoding of the received digital signal encoded in accordance with the Viterbi algorithm and in particular to calculate the following signals:

$$C_{2n} = \text{minimum } (C_n + a, C_{n+m/2} - a)$$

$$C_{2n+1} = \text{minimum } (C_n - a, C_{n+m/2} + a)$$

which are the signals of a Viterbi algorithm butterfly.

Furthermore, as discussed heretofore, because typically a DSP 10 has multiply and accumulate (MAC) units, the description of the improved DSP 10 of the present invention has the first and second multipliers 34 and 64 shown respectively. The first multiplier 34 along with its respective first ALU 38 and the first accumulator 40 forms a first MAC unit. Similarly, the second multiplier 64 along with its second ALU unit 58 and the second accumulator 60 forms a second ALU unit. However, as will be seen in the description that follows hereinafter, for the purposes of the present invention in decoding a received signal encoded in accordance with the Viterbi algorithm, the function of the first and the second multipliers 34 and 64, respectively, can be omitted. They are discussed herein only to the extent that a first and a second multiplier 34 and 64, respectively, are typically found in a conventional DSP because a conventional DSP needs to perform many other types of digital signal processing calculations which involve the use of MAC units. Finally, although a first and a second ALU 38 and 58, respectively, are disclosed, these ALU units may be replaced by simple adders and/or subtractors for the purposes of the improvement of the present invention.

In the operation of the improved DSP 10 of the present invention, for the purposes of decoding a received signal encoded in accordance with the Viterbi algorithm, a first plurality of binary signals $C_n$ is supplied along the first data bus 20. This plurality of binary signals may be stored in the first register 24. A second plurality of binary signals representing $C_{n+m/2}$ are supplied on the second data bus 22. The second plurality of binary signals may be stored in the second register 26. The first and second plurality of binary signals $C_n$ and $C_{n+m/2}$ have been retrieved from memory 12 and stored in the registers 24 and 26, respectively. The improved DSP 10 of the present invention can calculate the foregoing described equations in three cycles in the following manner:

First Cycle

During the first cycle, the first plurality of binary signals $C_n$ from the first data bus 20 are loaded through the second multiplexer 66 and supplied as input to the second multiplier 64. The third multiplexer 53 is operated such that the binary signal of "1" is passed through the third multiplexer 53 and is applied to the second input of the second multiplier 64. The second multiplier 54 performs the calculation of multiplying $C_n$ by "1" which results in the first plurality of binary signals $C_n$ being supplied to the second shifter 56.

Simultaneously, the second plurality of binary signals $C_{n+m/2}$ are supplied from the second data bus 22 into the second input of the first multiplier 34. The first multiplexer 32 is switched permitting the binary signal "1" to be supplied therethrough to the first input of the first multiplier 34. The first multiplier 34 multiplies the binary signal of "1" by the second plurality of binary signals $C_{n+m/2}$ and generates as its output the second plurality binary signals $C_{n+m/2}$. The second plurality of binary signals $C_{n+m/2}$ is supplied to the first shifter 36.

The first and second shifters 36 and 56, respectively, during the first cycle do not shift the received input plurality of binary signals and as a consequence the second plurality of binary signals $C_{n+m/2}$ and the first plurality of binary signals $C_n$ are generated as the output of the first and second shifters 36 and 56, respectively.

The second plurality of binary signals $C_{n+m/2}$ are then passed through the first ALU 38 and then loaded or stored in the first accumulator 40. The output of the accumulator 40 is then supplied back to the second input to the first ALU 38 and is ready for the next operation. Similarly, the output of the second shifter 56, namely the first plurality of binary signals $C_n$ are supplied through the second ALU 58 and stored in the second accumulator 60. The output of the second accumulator 60 is the supplied back to the second input of the second ALU 58 and are ready for the next operation.

Second Cycle

In this cycle, the transitional signal a is supplied along the second data bus 22. We shall assume that during the time that the first cycle described heretofore was operational, the other portions of the DSP 10, such as the data fetch unit were operational to bring the transitional signal a from memory 12 or registers in the DSP 10 (not shown) into the second register 26 and supply it to the second data bus 22. The transitional signal a on the second data bus 22 is supplied to the first multiplier 34. The first multiplexer 32 is switched such that again the binary signal of "1" is supplied therethrough to the first input of the first multiplier 34. The first multiplier 34 multiplies the binary signal of "1" by the transitional signal a and generates as its result the signal a which is supplied to the first shifter 36.

At the same time, the transitional signal a is supplied to the second multiplexer 66. The second multiplexer 66 is now switched permitting the transitional signal a from the second data bus 22 to be supplied therethrough and into the second multiplier 64 at its one input. In addition, the third multiplexer 53 is maintained to permit the binary signal of "1" to be passed therethrough to be supplied to the second input of the second multiplier 64. The second multiplier 54 operates to multiply the transitional signal a supplied at its one input by the binary signal "1" supplied at its second input to generate the binary signal a which is then supplied to the second shifter 56.

The first and second shifters 36 and 56 respectively, again are not operational and pass the transitional signal a therethrough. The transitional signal "a" is supplied to the second ALU 58. The second ALU 58 operates to generate the addition of the signal supplied at its first input by the signal supplied to its second input to generate as an output signal: $a+C_n$ or $C_n+a$. This output signal of $C_n+a$ is then loaded and stored in the second accumulator 60.

At the same time, the transitional signal a from the first shifter 36 is supplied to the first ALU 38. The sign of the signal supplied to the first input is switched so that $-a$ is then added to the signal $C_{n+m/2}$ supplied to the second input, resulting in $-a+C_{n+m/2}$ or $C_{n+m/2}-a$ as the output signal, which is stored in the first accumulator 40.

The plurality of binary signals stored in the first and second accumulators 40 and 60, respectively, are supplied back to the second input of the first and second ALU 38 and 58, respectively, and are ready for the next operation. In addition, the plurality of binary signals stored in the first and second accumulators 40 and 60, respectively, are supplied to the minimum ALU 50 which determines the lesser of the two plurality binary signals stored in the first and second accumulators 40 and 60, respectively. In response to the operation of the minimum ALU 50, the output signal is then stored in the third accumulator 52.

Third Cycle

At this point, the plurality of binary signals stored in the first and second accumulators 40 and 60, respectively, are the signals representing: $C_{n+m/2}-a$; and $C_n+a$, respectively. These are supplied to the second input of the first and second ALU 38 and 58, respectively. In addition, the transitional signal a is still on the second data bus 22. The transitional signal a would again be supplied to the first and second multipliers 34 and 64, respectively, being multiplied by the signal "1" from the first and third multiplexers 32 and 53, respectively. The resultant binary signal of "a," which is the output of the first and second multipliers 34 and 64, respectively, is supplied to the first and second shifters 36 and 56, respectively. The first and second shifters 36 and 56, each shifts the transitional signal a by one binary digit to the right thereby generating a binary signal representing 2a. The binary signal 2a is then supplied to the first and second ALU 38 and 58, respectively.

The sign of the signal 2a supplied at the first input to the second ALU 58 is changed so that the signal (−2a) results. The second ALU 58 then adds that signal (−2a) by the signal from the second accumulator 60 ($C_n+a$). The result is ($C_n-a$), which is then loaded and stored in the second accumulator 60. At the same time, the signal (2a) supplied to the first input of the first ALU 38 is added to the binary signal from the first accumulator 40 ($C_{n+m/2}-a$), resulting in the signal ($C_{n+m/2}+a$) which is then loaded and stored in the first accumulator 40.

The output of the first and second accumulators 40 and 60 are again supplied to the minimum ALU 50 which determines the lesser of the binary signal stored in the first and second accumulators 40 and 60. In response thereto, the lesser of the binary signals from the first and second accumulative 40 and 60 are then stored in a fourth accumulator 54.

Therefore, from the foregoing description, it can be seen that in three clock cycles, the improved DSP 10 of the present invention can perform the calculation of $C_{n2n}$=minimum ($C_n+a$, $C_{n+m/2}-a$)

$C_{2n+1}$=minimum ($C_n-a$, $C_{n+m/2}+a$)

The minimum ALU unit 50 can simply be a comparator that compares the output signals from the first and second accumulators 40 and 60 respectively to generate a control signal that directs the lesser of the two signals stored in the first and second accumulator 40 and 60 to be the output of the minimum ALU 50. In addition, the operation of the various components of the improved DSP 10 are under the control of a program control unit 62 which is a part of a conventional DSP. The program control unit 62 serves to the control the first, second, and third multiplexers 32, 66, and 53, respectively; first and second multipliers 34 and 64, respectively; first and second shifters 36 and 56, respectively; first and second ALUs 38 and 58, respectively, as well as changing the sign of the signal supplied at the first input; first and second accumulators 40 and 60, respectively; minimum ALU 50; and the third and fourth accumulators 52 and 54, respectively.

As can be seen from the foregoing, the improved DSP 10 of the present invention permits rapid calculation to decode a received digital signal encoded in accordance with the Viterbi algorithm, and in particular to calculate the Viterbi butterfly signal. The DSP is optimized to calculate the decoding of the Viterbi algorithm while at the same time maintaining compatibility with a conventional DSP to process signals requiring MAC units.

What is claimed is:

1. In a digital signal processor for decoding a received digital signal encoded in accordance with a Viterbi algorithm, wherein said digital signal processor calculates a first pair of binary signals $C_{2n}$ and $C_{2n+1}$ based upon a second pair of binary signals $C_n$ and $C_{n+m/2}$, and a transitional signal, a, in accordance with $$C_{2n} = \text{minimum } (C_n + a, C_{n+m/2} - a)$$

$$C_{2n+1} = \text{minimum } (C_n - a, C_{n+m/2} + a)$$

wherein the improvement to said digital signal processor comprising:

a first and a second data bus means for supplying simultaneously a first and a second plurality of binary signals, respectively;

a first and a second shifter means each for receiving simultaneously a first input signal, and for generating a third plurality of binary signals, respectively;

first means for supplying said first and said second plurality of binary signals as said first input signal to said first and said second shifter means, respectively;

a first and a second Arithmetic Logic Unit (hereinafter: "ALU") means, each for receiving a second and a third input signal and for generating an output signal, said output signal representative of said second input signal added to or subtracted by said third input signal;

second means for supplying said third plurality of binary signals from said first and second shifter means simultaneously as said third input signal to said first and second ALU means;

a first and a second accumulator means for receiving simultaneously said output signals from said first and second ALU means, respectively, for storing said output signals and for supplying same as said fourth input signals to said first and second ALU means, respectively;

minimum determining means for receiving said output signals from said first and second accumulator means, for comparing same, and for selecting the lesser of said output signals stored in said first and second accumulator means and for generating a fifth plurality of binary signals in response thereto; and third accumulator means for receiving and for storing said fifth plurality of binary signals.

2. The digital signal processor of claim 1 wherein said ALU means is an adder.

3. The digital signal processor of claim 1 wherein said first supplying means further comprises:

a first multiplier means for receiving said first plurality of binary signals and for generating a first multiplied signal in response thereto;

third means for supplying said first multiplied signal to said first shifter means as said first input signal thereto;

a second multiplier means for receiving said second plurality of binary signals and for generating a second multiplied signal in response thereto; and fourth means for supplying said second multiplied signal to said second shifter means as said first input signal thereto.

4. The digital signal processor of claim 1 wherein said first supplying means further comprises:

a first multiplexer means;

said first multiplexer means for receiving said first and said second plurality of binary signals from said first and second data bus means and for supplying either said first or said second plurality of binary signals to said first shifter means; and means for supplying said second plurality of binary signals from said second data bus means to said second shifter means.

5. The digital signal processor of claim 4 further comprising a program control means;

a) said program control means for causing said second pair of binary signals $C_n$ and $C_{n+m/2}$ to be supplied from said first and second data bus means, respectively, to said first supplying means, through said first and second shifter means, respectively, through said first and second ALU means, respectively, and stored in said first and second accumulator means, respectively;

b) said program control means for further causing said transitional signal a to be supplied from said second data bus means to said first supplying means to both said first and second shifter means, and to said first and second ALU means, respectively, causing said first ALU means to generate as its output signal:

$$C_{n+m/2} - a$$

and stored in said first accumulator means, causing said second ALU means to generate as its output signal $$C_n + a$$

and stored in said second accumulator means, and for causing said minimum determining means to compare $C_n + a$ and $C_{n+m/2} - a$ and for causing the lesser of said two output signals from said first and second accumulator means to be stored in said third accumulator means;

c) said program control means for causing said transitional signal a from said first data bus means to be shifted by one binary digit to generate a shifted signal of 2a by each of said first and second shifter means, and for supplying said shifted signal 2a to said first and second ALU means, respectively, causing said first ALU means to generate as its output signal:

$$C_{n+m/2}-a+2a$$

and stored in said first accumulator means, causing said second ALU means to generate as its output signal $$C_n+a-2a$$

and stored in said second accumulator means, and for causing said minimum determining means to compare $C_n+a-2a$ and $C_{n+m/2}-a+2a$ and for causing the lesser of said two output signals from said first and second accumulator means to be generated.

6. The digital signal processor of claim 5 further comprising:
   a fourth accumulator means; and
   and wherein said program control means causes the output signal of said minimum determining means of step (c) to be stored in said fourth accumulator means.

7. The digital signal processor of claim 5 wherein said program control means causes the operation of each of the steps in (a), (b) and (c) to occur in one cycle.

8. The digital signal processor of claim 5 wherein said ALU means is an adder.

9. A method of decoding a received digital signal encoded in accordance with a Viterbi algorithm by a digital signal processor, wherein said method of decoding calculates a first pair of binary signals $C_{2n}$ and $C_{2n+1}$ based upon a second pair of binary signals $C_n$ and $C_{n+m/2}$ and a transitional signal, a, in accordance with $$C_{2n} = \text{minimum} \ (C_n+a, \ C_{n+m/2}-a)$$

$$C_{2n+1} = \text{minimum} \ (c_n-a, \ C_{n+m/2}+a)$$

wherein said digital signal processor comprising:
   a first and a second data bus means for supplying simultaneously a first and a second plurality of binary signals, respectively;
   a first and a second shifter means each for receiving simultaneously a first input signal, and for generating a third plurality of binary signals, respectively;
   first means for supplying said first plurality of binary signals to said first shifter means as said first input signal;
   a first multiplexer means;
   said first multiplexer means for receiving said first and said second plurality of binary signals from said first and second data bus means and for supplying either said first or said second plurality of binary signals to said second shifter means;
   a first and a second Arithmetic Logic Unit (hereinafter: "ALU") means, each for receiving a second and a third input signal and for generating an output signal, said output signal representative of said second input signal added to or subtracted by said third input signal;
   second means for supplying said third plurality of binary signals from said first and second shifter means simultaneously as said third input signal to said first and second ALU means, respectively;
   a first and a second accumulator means for receiving simultaneously said output signals from said first and second ALU means, respectively, for storing said output signals and for supplying same as said fourth input signals to said first and second ALU means, respectively;
   minimum determining means for receiving said output signals from said first and second accumulator means, for comparing same, and for selecting the lesser of said output signals stored in said first and second accumulator means and for generating a fifth plurality of binary signals in response thereto; and
   third accumulator means for receiving and for storing said fifth plurality of binary signals; and
wherein said method comprising
   a) supplying simultaneously said second pair of binary signals $C_n$ and $C_{n+m/2}$ from said first and second data bus means, respectively, through said first and second shifter means, respectively, through said first and second ALU means;
   storing said second pair of binary signals $C_n$ and $C_{n+m/2}$ simultaneously in said first and second accumulator means, respectively;
   b) supplying said transition signal a from said first data bus means simultaneously to both said first and second shifter means and simultaneously to said first and second ALU means respectively;
   calculating $$C_n+a$$

by said first ALU means and generating an output signal in response thereto;
   calculating $$C_{n+m/2}-a$$

by said second ALU means and generating an output signal in response thereto, simultaneous with the calculation of $C_n+a$ by said first ALU means;
   storing said output signals of said first and second ALU means simultaneously in said first and second accumulator means;
   determining the lesser of said output signals ($C_n+a$ and $C_{n+m/2}-a$) stored in said first and second accumulator means respectively by said minimum determining means;
   storing said fifth plurality of binary signals from said minimum determining means, in said third accumulator means;
   c) shifting said transition signal a from said first data bus means, by said first and second shifter means, by one binary digit to generate simultaneously a shifted signal of 2a from said first and second shifter means;
   supplying said shifted signal 2a simultaneously to said first and second ALU means, respectively;
   calculating $$C_n 30 \ a-2a$$

by subtracting the shifted signal 2a from the output signal stored in said first accumulator mans, by said first ALU means and generating an output signal in response thereto;
   calculating $$C_{n+m/2}-a+2a$$

by adding the shifted signal 2a to the output signal stored in said second accumulator means, by said second ALU means and generating an output signal in response thereto, simultaneous with the calculation of $C_n+a-2a$ by said first ALU means;

storing said output signals of said first and second ALU means simultaneously in said first and second accumulator means; and determining the lesser of said output signals ($C_n-a$ and $C_{n+m/2}+a$) stored in said first and second accumulator means respectively by said minimum determining means.

10. The method of claim 9 further comprising the step of storing said lesser of said output signals ($C_n-a$ and $C_{n+m/2}+a$) from said minimum determining means, in a fourth accumulator means.

11. The method of claim 9 wherein each of said steps (a), (b) and (c) is performed in one clock cycle.

12. The method of claim 9 wherein said first and second ALU means is an adder means.

* * * * *

UNITED STATES PATENT AND TRADEMARK OFFICE
CERTIFICATE OF CORRECTION

PATENT NO. : 5,633,897
DATED : May 27, 1997
INVENTOR(S) : Gerhard P. Fettweis et al.

It is certified that error appears in the above-identified patent and that said Letters Patent is hereby corrected as shown below:

Col. 5, line 7, "54" should read -- 64 --.

Col. 5, line 61, "54" should read -- 64 --.

Claim 9, col. 10, line 59, "$C_n 30\ a-2a$" should read -- $C_n+a-2a$ --.

Signed and Sealed this

Second Day of December, 1997

Attest:

BRUCE LEHMAN

Attesting Officer   Commissioner of Patents and Trademarks